(12) United States Patent
Chen

(10) Patent No.: US 8,812,170 B2
(45) Date of Patent: Aug. 19, 2014

(54) CONTAINER DATA CENTER

(75) Inventor: Yung-Chu Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 370 days.

(21) Appl. No.: 13/275,370

(22) Filed: Oct. 18, 2011

(65) Prior Publication Data

US 2013/0068444 A1    Mar. 21, 2013

(30) Foreign Application Priority Data

Sep. 20, 2011    (TW) .............................. 100133848 A

(51) Int. Cl.
    *G05D 23/00*      (2006.01)
    *G05B 11/01*      (2006.01)
    *G01F 17/00*      (2006.01)
    *G01K 1/00*      (2006.01)

(52) U.S. Cl.
    USPC ................. 700/300; 700/19; 700/20; 702/53; 702/130

(58) Field of Classification Search
None
See application file for complete search history.

(56) References Cited

U.S. PATENT DOCUMENTS

| | | | | |
|---|---|---|---|---|
| 3,961,496 A * | 6/1976 | Ku | ................................. | 62/459 |
| 4,414,818 A * | 11/1983 | Turbard et al. | ............... | 62/176.1 |
| 4,537,068 A * | 8/1985 | Wrobel et al. | ............. | 73/861.02 |
| 4,629,031 A * | 12/1986 | Kato et al. | ..................... | 181/204 |
| 5,161,739 A * | 11/1992 | Saito et al. | ..................... | 237/9 R |
| 5,395,042 A * | 3/1995 | Riley et al. | .................. | 236/46 R |
| 5,407,129 A * | 4/1995 | Carey et al. | .................. | 236/91 E |
| 5,676,051 A * | 10/1997 | Sinemus | .......................... | 99/476 |
| 5,685,165 A * | 11/1997 | Bigelow, Jr. | .................... | 62/420 |
| 5,761,908 A * | 6/1998 | Oas et al. | .......................... | 62/3.2 |
| 5,945,746 A * | 8/1999 | Tracewell et al. | .............. | 307/43 |
| 6,034,871 A * | 3/2000 | Cheng | ............................ | 361/695 |
| 7,001,262 B2 * | 2/2006 | Tong | ................................ | 454/52 |
| 7,051,599 B2 * | 5/2006 | Foss | ................................. | 73/861.85 |
| 7,096,147 B1 * | 8/2006 | Low | .............................. | 702/132 |
| 8,065,921 B2 * | 11/2011 | Hsieh et al. | ..................... | 73/861 |
| 8,256,936 B2 * | 9/2012 | Liu et al. | ........................ | 362/392 |
| 2002/0000918 A1 * | 1/2002 | Hunter | .......................... | 340/584 |
| 2003/0130815 A1 * | 7/2003 | Cohen et al. | ..................... | 702/140 |
| 2003/0183433 A1 * | 10/2003 | MacKelvie | ................... | 180/68.1 |
| 2005/0139490 A1 * | 6/2005 | Chou et al. | ..................... | 205/777 |
| 2005/0246942 A1 * | 11/2005 | Mueller et al. | .................. | 43/124 |
| 2006/0168975 A1 * | 8/2006 | Malone et al. | .................. | 62/180 |

(Continued)

OTHER PUBLICATIONS

Wu et al., "Model Predictive Control of the Hybrid Ventilation for Livestock", IEEE, Proceedings of the 45th IEEE Conference on Decision & Control,2006, pp. 1460-1465.*

*Primary Examiner* — Kavita Padmanabhan
*Assistant Examiner* — Thomas Stevens
(74) *Attorney, Agent, or Firm* — Novak Druce Connolly Bove + Quigg LLP

(57) ABSTRACT

A container data center includes a cooling control system. The cooling control system reads a temperature of a container of the container data center and a direction of wind flowing across the container, and determines whether a first or a second cooling device of the container data center needs to be turned on according to the read temperature. The cooling control system further determines whether the read wind direction is the same to a direction of hot air expelled by the turned on cooling device. When the read wind direction is not the same as a direction of hot air expelled by the turned on cooling device, the cooling control system turns off the turned on cooling device, and turns on the other cooling device.

5 Claims, 5 Drawing Sheets

(56) References Cited

U.S. PATENT DOCUMENTS

| | | | |
|---|---|---|---|
| 2006/0208881 A1* | 9/2006 | Suzuki | 340/539.27 |
| 2007/0281639 A1* | 12/2007 | Clidaras et al. | 455/128 |
| 2008/0041233 A1* | 2/2008 | Bunn | 99/281 |
| 2008/0064317 A1* | 3/2008 | Yates et al. | 454/118 |
| 2008/0113599 A1* | 5/2008 | Ross et al. | 454/61 |
| 2009/0326721 A1* | 12/2009 | Sugiyama et al. | 700/282 |
| 2012/0075794 A1* | 3/2012 | Wei et al. | 361/679.48 |
| 2012/0287571 A1* | 11/2012 | Santos | 361/679.48 |

\* cited by examiner

CONTAINER DATA CENTER

TECHNICAL FIELD

The present disclosure relates to data centers, and particularly, to a container data center with a cooling control system.

DESCRIPTION OF RELATED ART

With the development of container data centers, cooling problem of the container data center require a great deal of attention. In many cases, two cooling devices are applied to alternately cool the container data centers. However, when wind outside of the container data center blows towards an outlet of the cooling device, the cooling device cannot fully expel hot air from the container data center.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present disclosure. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
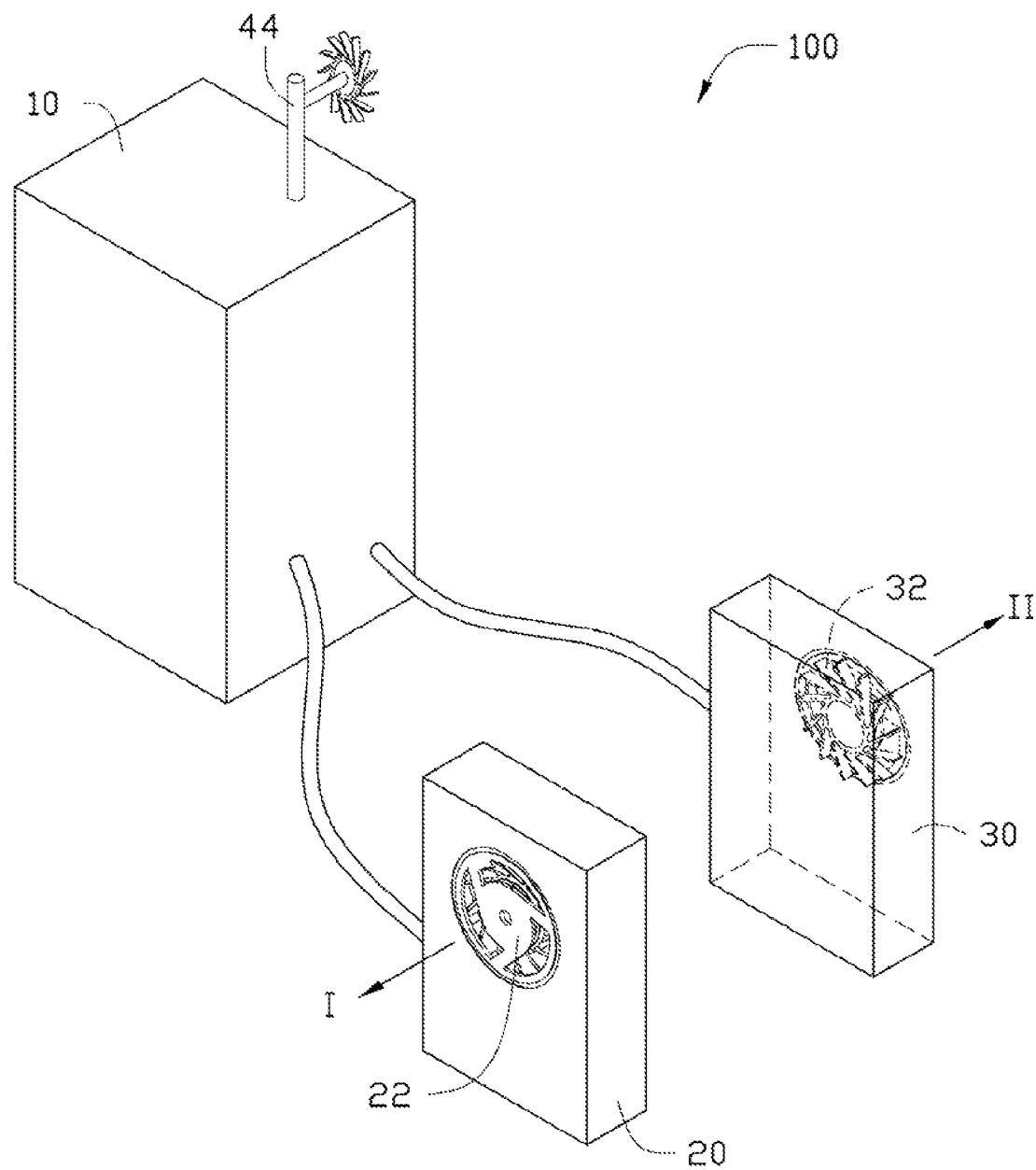
FIG. 1 is a schematic view of an exemplary embodiment of a container data center, wherein the container data center includes a cooling control system.
Figure 2:
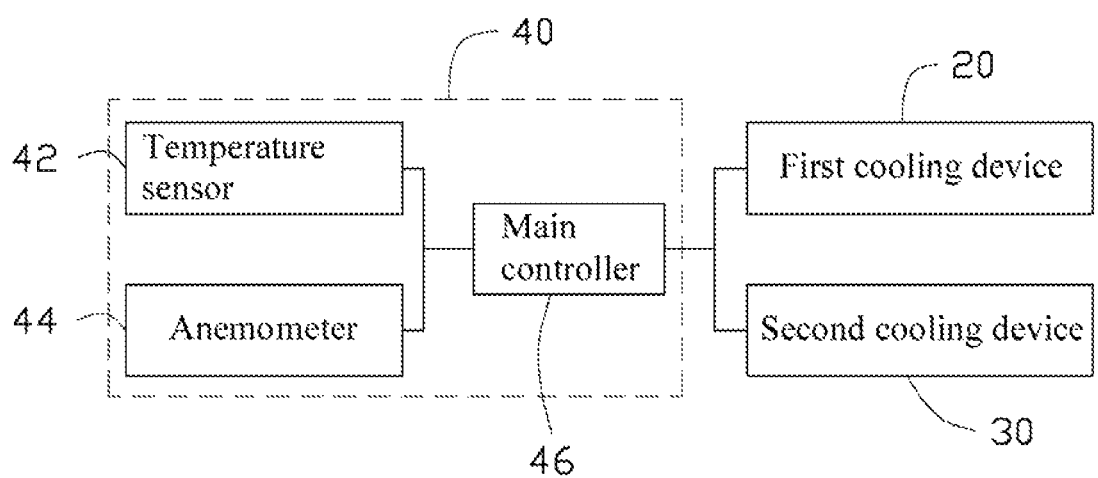
FIG. 2 is a block diagram of the cooling control system of FIG. 1 connected to first and second cooling devices, wherein the cooling control system includes a main controller.
Figure 3:
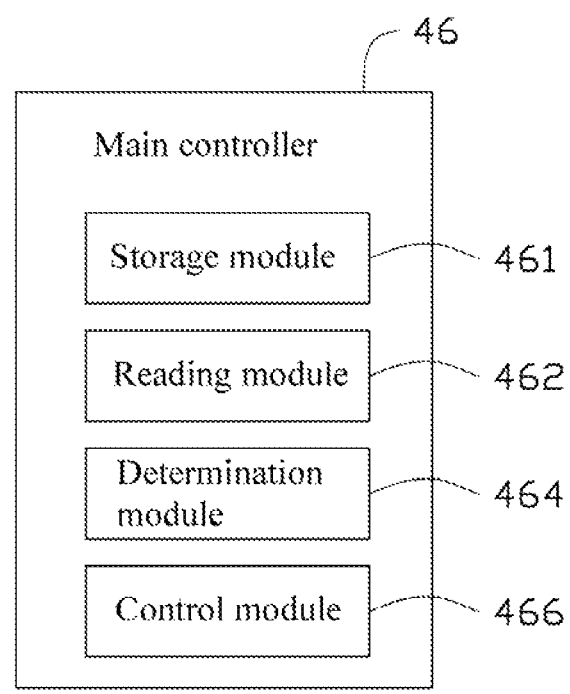
FIG. 3 is a block diagram of the main controller of FIG. 2.

Referring to the FIGS. 1-3, an embodiment of a container data center 100 includes a container 10, a first cooling device 20, a second cooling device 30, and a cooling system 40. The first and second cooling devices 20 and 30 are arranged in parallel beside the container 10 to cool the electronic elements in the container 10. A first outlet 22 is defined in the first cooling device 20 to expel hot air from the container 10 toward a first direction I. A second outlet 32 is defined in the second cooling device 30 opposite to the first outlet 22 to expel hot air from the container 10 toward a second direction II opposite to the first direction I.

The cooling control system 40 is used to control the first and second cooling device 20 and 30 to alternately cool the container 10. The cooling control system 40 includes a temperature sensor 42, an anemometer 44, and a main controller 46. The main controller 46 is connected to the temperature sensor 42, the anemometer 44, and the first and second cooling devices 20 and 30. The main controller 46 includes a storage module 461, a reading module 462, a determination module 464, and a control module 466.

The storage module 461 stores a predetermined temperature, a predetermined wind speed, the first direction I, the second direction II, and a predetermined time range.

The temperature sensor 42 is mounted in the container 10 to sense a temperature in the container 10.

The anemometer 44 is mounted on an outer surface of the container 10 to sense a speed and a direction of wind flowing across the container 10.

The reading module 462 is used to read the temperature of the container 10 from the temperature sensor 42, and output the read temperature to the determination module 464.

The determination module 464 is used to determine whether the read temperature is greater than the predetermined temperature. If the read temperature is lower than or equal to the predetermined temperature, it denotes that the first and second cooling devices 20 and 30 do not need to be turned on to cool the container 10. If the read temperature is greater than the predetermined temperature, it denotes that the first or second cooling device 20 or 30 needs to be turned on to cool the container 10.

The reading module 462 is further used to read a time in the container 10, and output the read time to the determination module 464. The determination module 464 is further used to determine whether the read time is in the predetermined time range. If the read time is in the predetermined time range, the determination module 464 outputs a first control signal to the control module 466. If the read time is not in the predetermined time range, the determination module 464 outputs a second control signal to the control module 466.

The control module 466 is used to turn on the first cooling device 20 and turn off the second cooling device 30 after receiving the first control signal, and further to turn off the first cooling device 20 and turn on the second cooling device 30 after receiving the second control signal.

The reading module 462 is used to read the sensed wind speed and wind direction from the anemometer 44, and output the read wind speed and wind direction to the determination module 464.

The determination module 464 is used to determine whether the read wind direction is the same as the direction of the hot air expelled by the turned on cooling device. If the read wind direction is the same to the direction of the hot air expelled by the turned on cooling device, it denotes that the wind across the container 10 will not affect the turned on cooling device to expel the hot air from the container 10. If the read wind direction is different from the direction of the hot air expelled by the turned on cooling device, it denotes that the wind across the container 10 may affect the turned on cooling device to expel the hot air from the container 10. When the read wind direction is different from the direction of the hot air expelled by the turned on cooling device, the determination module 464 is further used to determine whether the read wind speed is lower than that the predetermined speed. If the read wind speed is lower than the predetermined speed, it denotes that the wind across the container 10 will not affect the turned on cooling device to expel the hot air from the container 10, and the turned on cooling device can be kept on. If the read wind speed is greater than or equal to the predetermined speed, it denotes that the wind across the container 10 will affect the turned on cooling device to expel the hot air from the container 10, the turned on cooling device needs to be turned off, and the other cooling device needs to be turned on. The determination module 464 outputs the corresponding control signal to the control module 466 to turn off the turned on cooling device, while turning on the other cooling device.

Figure 4A:
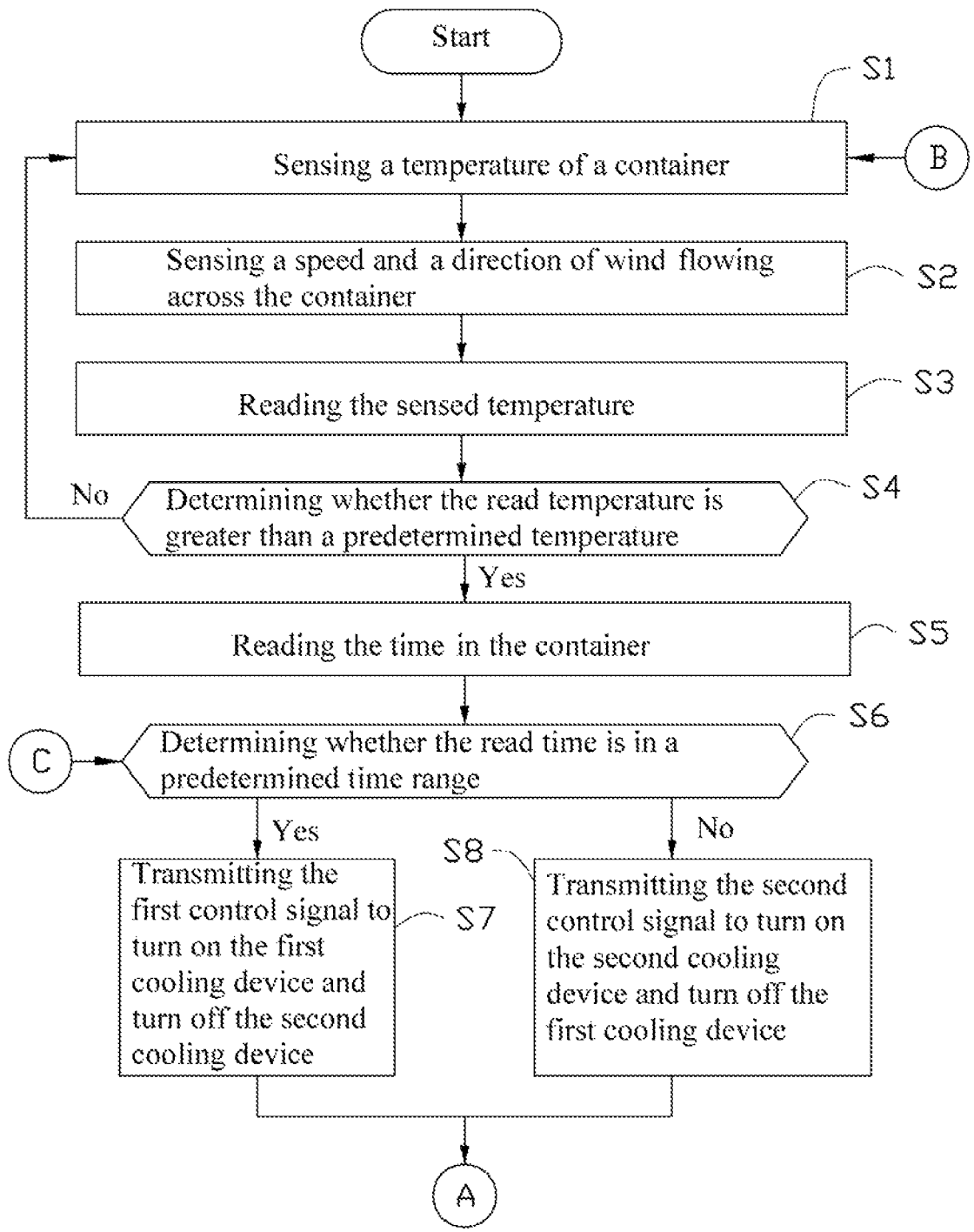
FIGS. 4A and 4B are flowcharts of an exemplary embodiment of a cooling control method.
Figure 4B:
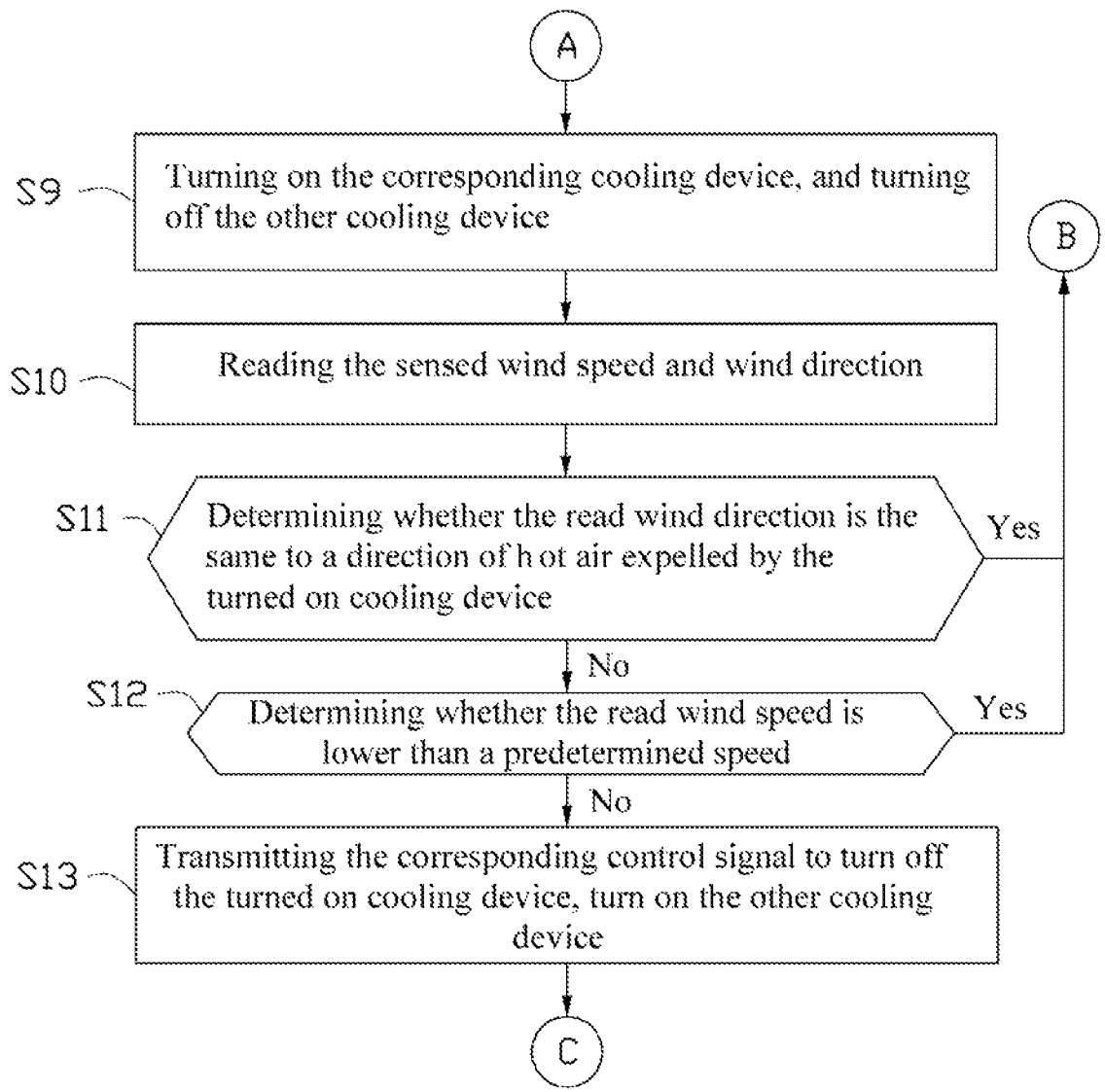

Referring to FIGS. 4A and 4B, an exemplary embodiment of a cooling control method is used to control the first and second cooling devices 20 and 30 to alternately cool the container 10. The cooling control method includes the following steps.

In step 1, the temperature sensor 42 senses the temperature of the container 10.

In step 2, the anemometer 44 senses the speed and direction of the wind flowing across the container 10.

In step 3, the reading module 462 reads the sensed temperature of the container 10 from the temperature sensor 42, and outputs the sensed temperature to the determination module 464.

In step 4, the determination module 464 determines whether the read temperature is greater than the predetermined temperature. If the read temperature is lower than or equal to the predetermined temperature, the procedure goes back to step 1. If the read temperature is greater than the predetermined temperature, the procedure goes to step 5.

In step 5, the reading module 462 reads the time in the container 10, and outputs the read time to the determination module 464.

In step 6, the determination module 464 determines whether the read time is in the predetermined time range. If the read time is in the predetermined time range, the procedure goes to step 7. If the read time is not in the predetermined time range, the procedure goes to step 8.

In step 7, the determination module 464 transmits the first control signal to the control module 466 to turn on the first cooling device 20 and turn off the second cooling device 30.

In step 8, the determination module 464 transmits the second control signal to the control module 466 to turn on the second cooling device 30 and turn off the first cooling device 20.

In step 9, the control module 466 turns on the corresponding cooling device, while turns off the other cooling device according to the received first or second control signal.

In step 10, the reading module 462 reads the sensed wind speed and the wind direction, and outputs the sensed wind speed and the wind direction to the determination module 464.

In step 11, the determination module 464 determines whether the read wind direction is the same as the direction of the hot air expelled by the turned on cooling device. If the read wind direction is the same as the direction of the hot air expelled by the turned on cooling device, the procedure goes back to step 1. If the read wind direction is different from the direction of the hot air expelled by the turned on cooling device, the procedure goes to step 12.

In step 12, the determination module 464 determines whether the read wind speed is lower than the predetermined speed. If the read wind speed is lower than the predetermined speed, the procedure goes back to step 1. If the read wind speed is greater than or equal to the predetermined speed, the procedure goes to step 13.

In step 13, the determination module 464 transmits the corresponding control signal to the control module 466 to turn off the turned on cooling device, while turn on the other cooling device, the procedure goes back to step 6.

In other embodiments, if the read wind direction is different from the direction of the hot air out of the turned on cooling device, the control module can directly turn off the turned on cooling device, while turn on the other cooling device.

Although numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A container data center comprising:
a container;
a first cooling device defining a first outlet to expel hot air from the container in a first direction;
a second cooling device defining a second outlet to expel the hot air from the container in a second direction opposite to the first direction; and
a cooling control system comprising:
a temperature sensor to sense a temperature in the container;
an anemometer to sense a speed and a direction of wind flowing across the container; and
a main controller connected to the temperature sensor, the anemometer, the first cooling device, and the second cooling device, the main controller comprising:
a storage module to store a predetermined temperature, a predetermined speed, and a predetermined time range;
a reading module to read the temperature of the container from the temperature sensor and read a time in the container;
a determination module to determine whether the read temperature is greater than the predetermined temperature, wherein if the read temperature is greater than the predetermined temperature, the determination module determines whether the read time is in the predetermined time range, if the read time is in the predetermined time range, the determination module outputs a first control signal, if the read time is not in the predetermined time range, the determination module outputs a second control signal; and
a control module to turn on the first cooling device and turn off the second cooling device after receiving the first control signal, and turn off the first cooling device and turn on the second cooling device after receiving the second control signal;
wherein the read module is further used to read the speed and the direction of the wind sensed by the anemometer, the determination module is further used to determine whether the direction of the wind read by the read module is the same as a direction of the hot air expelled by the turned on cooling device, if the direction of the wind read by the read module is different from the direction of the hot air expelled by the turned on cooling device, the determination module determines whether the speed of the wind read by the read module is lower that the predetermined speed, if the speed of the wind read by the read module is greater than or equal to the predetermined speed, the determination module outputs the first or second control signal to the control module to turn off the turned on cooling device, and turn on the turned off cooling device.

2. The container data center of claim 1, wherein the temperature sensor is mounted in the container, the anemometer is mounted on the container.

3. A cooling control system to control first and second cooling devices of a container data center to alternately cool a container of the container data center, wherein a first outlet of the first cooling device faces a first direction, a second outlet of the second cooling device faces a second direction opposite to the first direction, the cooling control system comprising:

a temperature sensor to sense a temperature in the container;

an anemometer to sense a speed and a direction of wind flowing across the container; and a main controller connected to the temperature sensor, the anemometer, the first cooling device, and the second cooling device, the main controller comprising:

a storage module to store a predetermined temperature, a predetermined speed, and a predetermined time range;

a read module to read the temperature in the container from the temperature sensor and read a time in the container;

a determination module to determine whether the read temperature is greater than the predetermined temperature, wherein if the read temperature is greater than the predetermined temperature, the determination module determines whether the read time is in the predetermined time range, if the read time is in the predetermined time range, the determination module outputs a first control signal, if the read time is not in the predetermined time range, the determination module outputs a second control signal; and a control module to turn on the first cooling device and turn off the second cooling device after receiving the first control signal, and turn off the first cooling device and turn on the second cooling device after receiving the second control signal;

wherein the read module is further used to read the speed and the direction of the wind sensed by the anemometer, the determination module is further used to determine whether the direction of the wind read by the read module is the same as a direction of the hot air expelled by the turned on cooling device, if the direction of the wind read by the read module is different from the direction of the hot air expelled by the turned on cooling device, the determination module determines whether the speed of the wind read by the read module is lower than the predetermined speed, if the speed of the wind read by the read module is greater than or equal to the predetermined speed, the determination module outputs the first or second control signal to the control module to turn off the turned on cooling device, and turn on the turned off cooling device.

4. The cooling control system of claim 1, wherein the temperature sensor is mounted in the container, and the anemometer is mounted on the container.

5. A cooling control method to control first and second cooling devices of a container data center to alternately cool a container of the container data center, the cooling control method comprising steps:

a. sensing a temperature of the container;

b. sensing a speed and a direction of wind flowing across of the container;

c. reading the sensed temperature of the container;

d. determining whether the read temperature is greater than a predetermined temperature; wherein if the read temperature is lower than or equal to the predetermined temperature, going back to the step of sensing a temperature of the container;

e. reading a time in the container if the read temperature is greater than the predetermined temperature;

f. determining whether the read time is in a predetermined time range;

g. transmitting a first control signal to turn on the first cooling device and turn off the second cooling device, if the read time is in the predetermined time range;

h. transmitting a second control signal to turn on the second cooling device and turn off the first cooling device if the read time is not in the predetermined time range;

i. turning on the first cooling device and turning off the second cooling device according to the first control signal, or turning on the second cooling device and turning off the first cooling device according to the second control signal;

j. reading the speed and the direction of the wind sensed by the step b;

k. determining whether the direction of the wind read by the step j is the same to a direction of hot air expelled by the turned on cooling device, wherein if the direction of the wind read by the step j is the same as the direction of the hot air expelled by the turned on cooling device, going back to the step of sensing a temperature of the container;

l. determining whether the speed of the wind read by the step j is lower than the predetermined speed if the direction of the wind read by the step j is different from the direction of the hot air expelled by the turned on cooling device, wherein if the speed of the wind read by the step j is lower than the predetermined speed, going back to the step of sensing a temperature of the container;

m. transmitting the first or second control signal to turn off the turned on cooling device while turning on the turned off cooling device if the speed of the wind read by the step j is greater than or equal to the predetermined speed, going back to the step i.

\* \* \* \* \*